United States Patent

[11] 3,582,823

[72] Inventor Rudolph F. Pasos
Burlingame, Calif.
[21] Appl. No. 801,475
[22] Filed Feb. 24, 1969
[45] Patented June 1, 1971
[73] Assignee Fairchild Camera and Instrument Corporation
Syosset, Long Island, N.Y.

[54] VOLTAGE CONTROLLED OSCILLATOR IN WHICH CAPACITIVE DIODES BECOME RESISTIVE DURING PORTIONS OF EACH CYCLE
4 Claims, 12 Drawing Figs.

[52] U.S. Cl. .......... 331/96, 331/117D, 331/177V, 332/30V
[51] Int. Cl. .......... H03b 3/04, H03b 5/18
[50] Field of Search .......... 331/96, 99, 101, 117 D, 117 V; 332/30 V; 307/320

[56] References Cited

UNITED STATES PATENTS

| | | | |
|---|---|---|---|
| 3,293,571 | 12/1966 | Bott | 307/320X |
| 3,370,254 | 2/1968 | Keller | 331/117 |
| 3,377,568 | 4/1968 | Kruse, Jr. et al. | 331/117 |
| 3,397,365 | 8/1968 | Kruse, Jr. et al. | 331/177(V)X |
| 3,483,483 | 12/1969 | Erler et al. | 331/177(V)X |

OTHER REFERENCES

Micronotes, Vol. 1, No. 1, May 1963, pp 2— 7, 307— 320.

*Primary Examiner*—John Kominski
*Assistant Examiner*—Siegfried H. Grimm
*Attorneys*—Roger S. Borovoy and Alan H. MacPherson

ABSTRACT: By varying the voltage applied to two oppositely poled varactors, placed in series in the resonant circuit of a microwave oscillator, the portion of each oscillatory cycle in which each varactor acts as a capacitor as opposed to a low resistance, is varied, thereby linearly varying the oscillatory frequency of the circuit.

INVENTOR.
Rudolph F. Pasos

BY [signature]
[signature]
Attorneys

INVENTOR.
Rudolph F. Pasos
BY [signature]
[signature]
Attorneys

VOLTAGE CONTROLLED OSCILLATOR IN WHICH CAPACITIVE DIODES BECOME RESISTIVE DURING PORTIONS OF EACH CYCLE

BACKGROUND OF THE INVENTION

1. Field of the Invention

The invention relates to the field of voltage controlled oscillators operating in the microwave frequency range.

2. Description of the Prior Art

In the prior art, numerous voltage controlled oscillators have been disclosed. Certain of these prior art voltage controlled oscillators have been employed varactors. the varactors' electrical characteristics are very suitable for such oscillators. When the varactor is reversed biased (not conducting), it has the general electrical characteristic of a capacitor, but which the unique characteristic that its capacitance is a function of the applied voltage. Therefore, the capacitance of an oscillator tuning circuit employing varactors as the capacitor element may be made tunable by applying a variable voltage to the varactor. A description of the varactor can be found in "Microwave Solid State Engineering" by L. S. Nergaard and N. Glickson, Chapter 3, Pages 45—48, published by Van Nostrand.

Recent examples of voltage controlled oscillator circuits employing varactors can be found in U.S. Pat. No. 3,332,035 and in an article by K. M. Johnson, "Microwave Varactor Tuned Transistor Oscillator Design," Institute of Electrical and Electronics Engineers, Transactions on Microwave Theory and Techniques, Vol. MTT–14, No. 11, Nov. 1966. Johnson analyzes the varactor as a circuit element in a voltage controlled oscillator. Johnson's analysis, based on a "small signal" approach, assumes that the varactor has a fixed capacitance for any given control voltage. For the analysis to be valid, the peak-to-peak voltage oscillation of the tuning circuit as sensed by the varactor must be small when compared to the direct current control voltage. The circuits that have evolved from the "small signal" analysis of the varactor have the disadvantage of requiring a relatively large direct current voltage (approximately 100 volts) to obtain tuning over a frequency range such as one octave. For example, FIG. 5 of U.S. Pat. No. 3,332,035 illustrates a required voltage range of approximately −15 volts to 100 volts to obtain tuning over 1 octave. Similarly, the Johnson article FIG. 13 illustrates use of a differential voltage of approximately 100 volts for tuning over 1 octave.

In many applications, the available control voltage is considerably less than 100 volts. Consequently, a voltage controlled oscillator should be tunable over a wide range of frequencies in response to a control voltage variable over a range on the order of several volts, at the most. The control voltage should not, of course, be so small that system noise becomes significant.

SUMMARY OF THE INVENTION

This invention overcomes these disadvantages of prior art microwave oscillators. Using the techniques of this invention, the oscillation frequency of microwave oscillator can be varied over approximately 1 octave with a control voltage variation of, at the most, 35 volts. The output signal from the oscillator is approximately uniform over this frequency range, dropping only about one-half db. at the upper end of the octave from its amplitude at the lower end of the octave. Because of the symmetrical characteristics of the circuit, the second harmonic is at least 30 db. beneath the fundamental frequency of oscillation. Control of the oscillating frequency can be achieved either by varying a DC bias voltage across varactors in the LC resonant circuit, or by varying the amplitude of the RF oscillatory signal itself.

According to this invention, two oppositely poled varactors are placed in series in the resonant circuit of the microwave oscillator. A bias voltage, placed on the node between the two varactors, is of such a magnitude that each varactor is forward biased into its low impedance region only for a portion of one cycle of the oscillator output signal. When one varactor is forward biased into its low impedance state, the other varactor is back biased to act like a capacitor. Effectively, one varactor is switched out of the series resonant LC circuit for a portion of each cycle while the other varactor is introducing capacitance into the circuit. By controlling the bias voltage, the effective average capacitance in the series resonant LC circuit is controlled and thus the oscillatory frequency of the circuit is controlled.

The output voltage from the circuit is taken off the collector of a grounded emitter driving transistor. To maintain this output voltage constant with frequency, a third varactor is connected as a capacitor across the collector-emitter leads of this transistor. As the output frequency increases, the capacitance of this varactor decreases thus essentially maintaining the output impedance across the collector of this transistor and thus the output voltage on the collector, constant.

Figure 1:
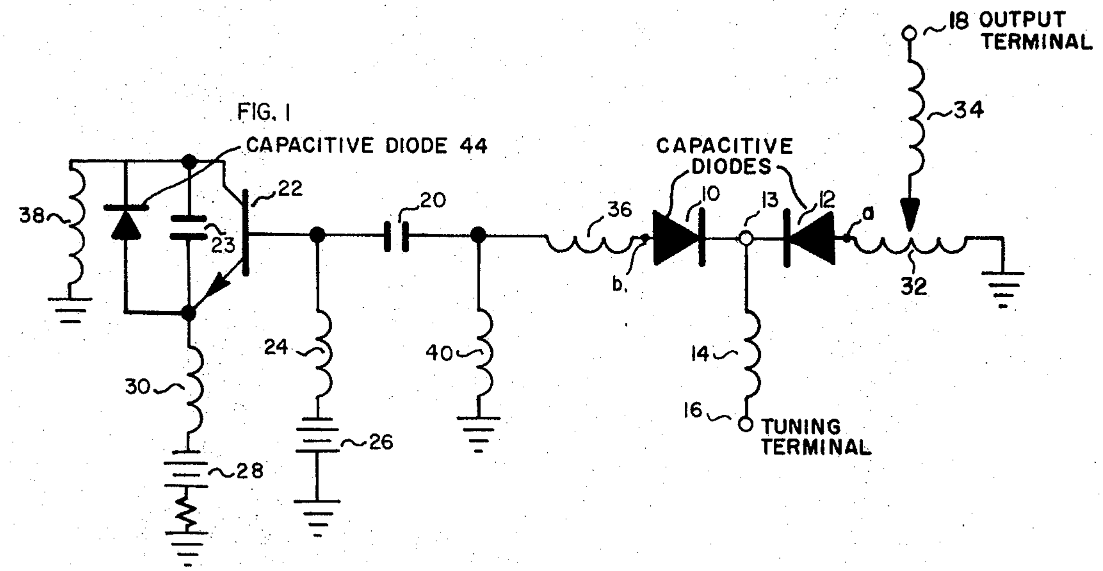
FIG. 1 illustrates a circuit diagram for the oscillator.

FIGS. *4a* and *4b* show two circuits equivalent at microwave frequencies to the circuit shown in FIG. 1.

FIGS. *5a* through *5f* are useful in explaining the operation of this invention.

Figure 6:
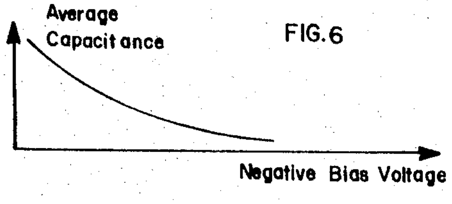

FIG. 6 shows qualitatively as a function of bias voltage, the average capacitance introduced into the LC resonant circuit of FIGS. *4a* and *4b* by varactors 10 and 12.

DETAILED DESCRIPTION OF THE INVENTION

FIG. 1 illustrates the circuit diagram of an embodiment of the voltage controlled oscillator. Varactors 10 and 12 have their cathode coupled at circuit junction 13. The oscillator tuning voltage is applied at terminal 16 to inductor 14 coupled between terminal 16 and circuit junction 13. Transmission line 32 is coupled between the anode of varactor 12 and electrical ground. Terminal 18 is the oscillator output and is coupled to transmission line 32 by transmission line 34. The anode of varactor 10 is coupled to transmission line 36. Inductor 40 is coupled between electrical ground and transmission line 36. Capacitor 20 is coupled to the junction formed by inductor 40 and transmission line 36.

The electrical signal source for the oscillator is obtained from transistor 22. The base of transistor 22 is coupled to capacitor 20 which essentially serves as DC blocking capacitor. The base bias voltage is provided by voltage source 26 coupled to the base of transistor 22 by choke 24. The collector of transistor 22 is coupled to electrical ground through transmission line 38.

The main power source for transistor 22 is voltage source 28. Inductor 30 is coupled between voltage source 28 and the emitter of transistor 22.

The oscillator circuit is tuned by applying a direct current voltage to terminal 16. This tuning voltage is applied to varactors 10 and 12 through indicator 14. It is this voltage which provides the reverse biasing for the varactors and results in the varactors having the electrical characteristics of a capacitor. When the tuning voltage is changed, the effective capacitance of varactors 10 and 12 also changes. This change in capacitance causes the tuned circuit of the oscillator (composed of varactors 10 and 12, and transmission lines 36 and 32) to change its resonant frequency, thereby changing the oscillator's operating frequency.

The transmission lines 32, 34, 36 and 38 have been shown schematically as inductors in FIG. 1. These circuit elements may be any circuit element exhibiting the general characteristics of transmission lines at microwave frequencies; that is distributed capacitance and inductance. For example, inductive rods, coaxial cabling or other similar elements may be used in these applications.

Capacitor 23 provides feedback for the oscillator. It should be noted that this capacitor may not be required if the inherent emitter-to-collector capacitance of transistor 22 is sufficient to provide the feedback. In addition, parasitic capacitance from the leads coupling indicator 30 to the emitter of transistor 22 and transmission line 38 to the collector of transistor 22 may provide sufficient coupling for the feedback. Varactor 44, connected across the collector and emitter of transistor 22, makes the collector voltage on transistor 22 flat over a frequency range from 10 megahertz to about 1 gigahertz. Without varactor 44, this collector voltage decreases with increasing frequency.

Inductors 14, 24, 30 and 40 are used to isolate the low impedance direct current voltage sources 26, 28 and 16 from the remainder of the circuit. Generally, the direct current voltage sources are of low impedance and would load the microwave circuit over its operating frequencies. The inductors provide a high impedance choke at the microwave frequencies and yet provide a low resistive path for the direct current.

For the circuit illustrated in FIG. 1, oscillator operation is achievable between the frequencies of 500 MHz. and 1100 MHz. with the following values for components:

Transmission Line 32—200Ω, one-tenth wavelength at 750Mhz.
Transmission Line 38—200Ω, one-tenth wavelength at 750 Mhz.
Transmission Line 36—200Ω, one-tenth wavelength at 750 Mhz.
Transmission Line 34—200Ω, one-eigth wavelength at 750 Mhz.
Inductor 30—0.1$\mu$h.
Inductor 40—0.1$\mu$h.
Inductor 14—0.1$\mu$h.
Voltage potential 28—–20 volts
Inductor 24—0.1$\mu$h.
Voltage potential 26—–12 volts
Capacitor 20—500 pf.
Capacitor 23—2 to 10 pf.
Transistor 22—MT 1038 (Fairchild)
Varactor 10—MD100 (Fairchild)
Varactor 12—MD100 (Fairchild)
Varactor 44—MD100 (Fairchild)

Varactors 10 and 12 are buffered from the capacitance of transistor 22 and coupling capacitor 20 by transmission line 36. The effect of this buffering is that varactors 10 and 12 sense a "large signal" at the microwave frequency at which the oscillator operates. With the addition of transmission line 36, the microwave signal sensed by varactors 10 and 12 can no longer be considered as negligible when compared to the direct current tuning voltage.

As a result, the instantaneous variation of capacitance of varactors 10 and 12 as a function of the magnitude of the oscillating signal at microwave frequency applied to these varactors must be considered in analyzing the operation of this circuit. In other words the "small signal" analysis of the prior art and particularly of the previously mentioned Johnson article no longer suffices to explain the operation of this circuit. Rather, varactors 10 and 12 must be analyzed as nonlinear circuit elements.

Figure 3:
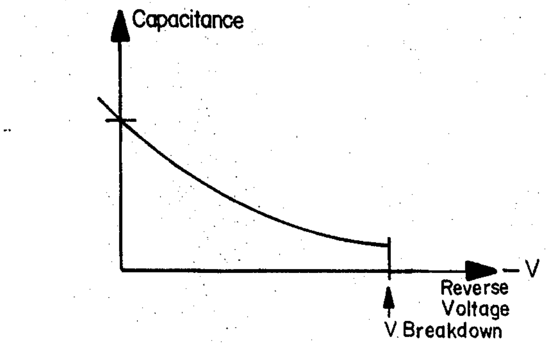
FIG. 3 shows capacitance versus voltage of a typical varactor.
Figure 2:
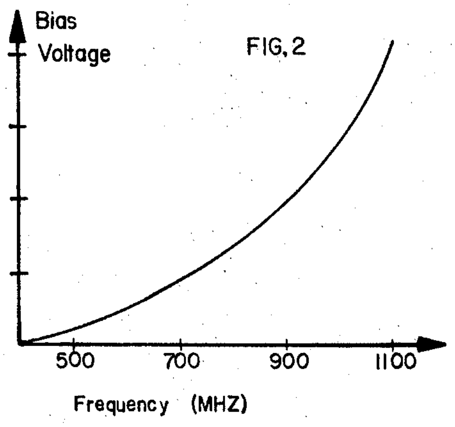
FIG. 2 illustrates a graph of the tuning voltage versus frequency for the oscillator shown in FIG. 1.
Figure 4B:
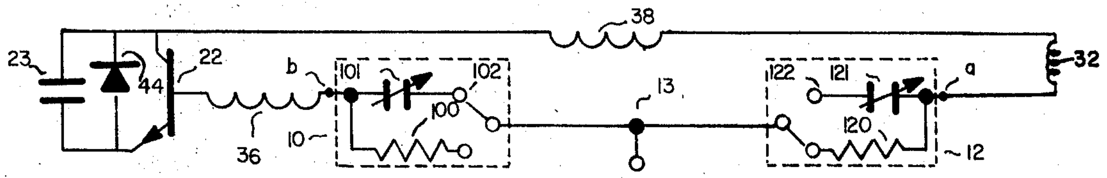
Figure 4A:
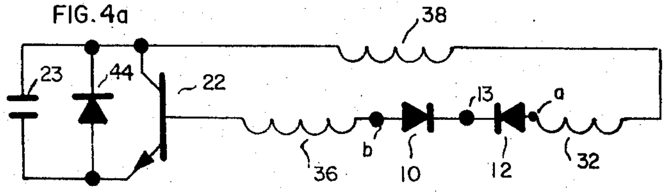

While a mathematical analysis of the operation of this circuit is made difficult by the nonlinear characteristics of the varactors, a graphical analysis will help in understanding the operation of the circuit. FIGS. 4*a* and 4*b* show the AC circuit equivalent to the circuit shown in FIG. 1. FIG. 4*a* shows the circuit of FIG. 1 with the DC chokes and blocking capacitor 20 removed. Essentially, the AC equivalent circuit consists of a transistor 22 with capacitor 23 feeding back the signal from its emitter to its collector. The collector is inductively coupled by transmission line 38 to an LC resonant circuit in series with the base of transistor 22. This LC resonant circuit comprises transmission lines 32 and 36, supplying inductance to the circuit and varactors 10 and 12, supplying essentially capacitance to the circuit. As shown in FIG. 3, the capacitance of a varactor is a function of the back voltage applied to the varactor. As the back voltage across the varactor increases, the capacitance of the varactor decreases. Conversely, as the forward bias on the varactor exceeds about 0.5 volts, the capacitance of the varactor becomes very large. Thus the impedance caused by this capacitance becomes very small, and the main impedance of the varactor to the flow of current in the forward direction is the varactor's forward-biased resistance, on the order of 100 ohms. Because varactors 10 and 12 are oppositely poled in series, when varactor 10 is forward biased, varactor 12 will, at some time, be reversed biased and vice versa. As each varactor changes from being reverse biased to being forward biased, the varactor switches from a variable capacitive impedance to a resistive impedance. Each varactor can thus be considered as "switching" capacitance into and out of the LC circuit over a portion of each cycle of microwave signal.

FIG. 4*b* shows the circuit of FIG. 4*a* with varactor 10 represented by the parallel combination of variable capacitor 101 and resistor 100. Switch 102 selectively connects either capacitor 101 or resistor 100 into the circuit. Varactor 12 is represented by the parallel combination of variable capacitor 121 and resistor 120. Switch 122 selectively connects either the capacitor 121 or resistor 120 into the circuit. When switch 102 connects capacitor 101 into the circuit, switch 122 will, at some time, connect resistor 120 into the circuit and vice versa. Resistors 100 and 124 are very small resistors on the order, at the most, of 100ohms.

Figures 5A, 5B, 5C, 5D, 5E, 5F:
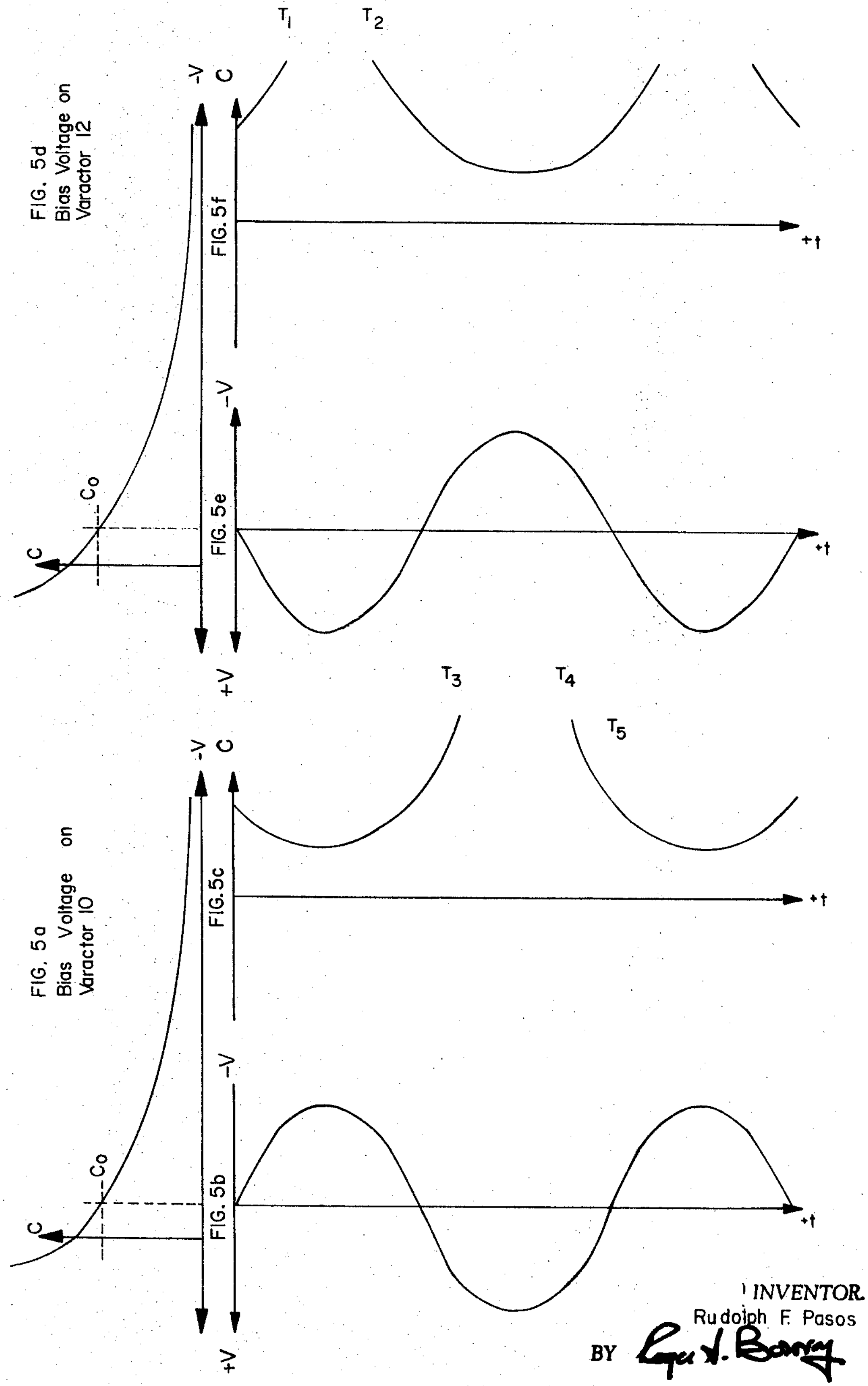

FIGS. 5*a* through 5*f* show graphically the operation of the circuit shown in FIG. 4*a* or 4*b*. FIG. 5*a* and 5*d* represent the voltage-capacitance curves of varactors 10 and 12 respectively. FIGS. 5*b* and 5*e* represent the voltage variation with time across varactors 10 and 12 respectively. Because these varactors are oppositely poled, the voltage variations across these varactors are 180°, or thereabouts, out of phase. FIGS. 5*c* and 5*f* show the capacitance versus time of varactors 10 and 12 respectively.

The oscillatory frequency $\Omega_o$, of a series resonant LC circuit equals $1/\sqrt{LC}$ where L is the series inductance and C is the series capacitance of the circuit. Thus by decreasing the capacitance of the circuit, the resonant frequency of the circuit is increased. Because of the square root, to double the frequency, capacitance must be decreased to one-fourth its initial value. Now as shown in FIGS. 5*a* through 5*c*, when the oscillatory microwave signal applied across varactor 10 has zero amplitude, the capacitance of varactor 10 is given by the negative bias voltage across varactor 10. This capacitance, denoted as $C_0$ in FIGS. 5*a* and 5*d*, can be varied by varying the bias voltage applied at node 13 (FIG. 1) across varactors 10 and 12. As the voltage (shown in FIG. 5*e*) at the node *a* between varactor 12 and transmission line 32 becomes increasingly positive, the capacitance of varactor 12 increases.

When the voltage difference across varactor 12, which is determined by both the bias voltage applied at node 13 between varactors 10 and 12 and the instantaneous voltages of the microwave signal at nodes 13 and *a*, becomes sufficiently positive, about 0.5 volts, the capacitance of varactor 12 becomes suddenly extremely large, as shown by FIG. 5*f*. At this time, the impedance exhibited by varactor 12 switches from a capacitive impedance to a resistive impedance. Because varactor 12 is almost a short circuit, the voltage at node *a* is essentially the voltage applied at node 13. Consequently, varactor 10 becomes increasingly back biased. This is shown in FIGS. 5*a* and 5*b* by the voltage versus time curve at the corresponding time. As a result, the capacitance of varactor 10 decreases as shown in FIG. 5*c*.

The effective change of capacitance in series with inductive transmission lines 32 and 36 however, is given by the net change of the capacitance of varactors 12 and 10. When both varactors 10 and 12 are back biased, the total series capacitance inserted into the circuit by varactors 10 and 12 is given by $C_{10}C_{12}/(C_{10}+C_{12})$, where $C_{10}$ and $C_{12}$ represent the instantaneous capacitances of varactors 10 and 12 respectively. However, when varactor 12 becomes forward biased and switches to a resistive rather than capacitive impedance, the total series capacitance suddenly approximately doubles to that placed in the circuit by varactor 10 alone. Both the magnitude of the bias voltage at node 13 and the amplitude of the microwave signal determine the time over one cycle of microwave signal that the total series capacitance in the circuit is given by one varactor alone. The average capacitance introduced into the circuit by varactors 10 and 12 over one cycle of the output signal gives the resonant frequency of the circuit. The smaller this average capacitance, the higher the resonant frequency.

As the signal on node *a* reaches a peak and then drops in magnitude again, at some point in time it equals the DC bias voltage at node 13. At this point, varactor 12 is again back biased. As a result, as shown in FIGS. 5*d* to 5*f*, varactor 12 again exhibits capacitance (i.e., varactor 12 switches capacitance into the circuit) and the effective series capacitance of varactors 10 and 12 drops from the value given by $C_{10}$ alone to about half that value, representing the contribution of both varactors 10 and 12.

Meanwhile, the voltage on node *b*, between transmission line 36 and varactor 10, is increasing in magnitude. When this voltage exceeds the voltage on node 13 by a selected amount, about 0.5 volts, varactor 10 becomes forward biased. As shown in FIGS. 5*a* through 5*c*, at this time the impedance introduced into the circuit by varactor 10 changes very suddenly from a capacitive impedance to a resistive impedance. As a result, the series capacitance in the circuit again increases to twice the capacitance present when both varactors 10 and 12 are in the circuit. This is shown in FIG. 5*c*.

A comparison of FIGS. 5*c* and 5*f* shows that varactors 10 and 12 switch approximately 180° out of phase from the low capacitance to the high capacitance or low resistance state. The portion of each cycle during which each varactor is in the low impedance state, as opposed to the low capacitance state, is determined primarily by adjusting the tuning voltage on lead 16 and node 13 (FIG. 1) but also by the amplitude of the microwave signal. As this tuning voltage is made more negative, the average capacitance of varactors 10 and 12 over one cycle is made smaller. This increases the oscillating frequency of the circuit. Because the bias voltage on node 13 corresponds to a point on the capacitance-voltage curves of varactors 10 and 12 at which a very small change in tuning voltage causes a rather large change in capacitance, the oscillatory frequency of the LC series circuit connected to the base of transistor 22 is easily changed by just a small change in tuning voltage. Moreover, because of the symmetrical characteristics of varactors 10 and 12 and the sensitive nature of their capacitance-voltage curves, a microwave oscillator tunable over a wide frequency range is possible using the structure of this invention.

FIG. 6 shows qualitatively that as the back bias across varactors 10 and 12 increases, the average capacitance decreases. The large change in capacitance for a small change in bias voltage demonstrates the sensitive response of the circuit of FIGS. 1, 4*a* and 4*b* to a change in bias voltage.

Because of the symmetrical arrangement of varactors 10 and 12, the second harmonic of the output signal is down at least 30 db. from the fundamental.

In another embodiment, snap diodes were substituted for varactors 10 and 12. These diodes also switched capacitance into and out of the LC resonant circuit in response to a change in the bias voltage at node 13.

What I claim is:

1. A microwave oscillator containing an active element with at least two leads coupled to a resonant circuit together with means for biasing both said active element and said resonant circuits, characterized in that:

said active element has connected across two of its at least two leads a circuit means comprising a parallel-connected back biased varactor and a capacitor for maintaining the level of the output signal from the active element approximately constant over a give frequency range;

said resonant circuit includes two oppositely poled, series-connected elements which, when reversed biased, introduce capacitance into the circuit, and which, when forward biased, introduce resistance into the resonant circuit; and said means for biasing biases said two oppositely poled, series-connected elements so that for a nonsimultaneously occurring portion of each cycle of the output signal from said oscillator, each of said two elements switches from introducing capacitance into said resonant circuit to introducing resistance into said resonant circuit.

2. Structure as in claim 1 in which each of said two oppositely poled series-connected elements comprises a varactor, each varactor, when reversed biased, exhibiting a capacitance which decreases as the reverse bias voltage increases, and, when forward biased by more than a minimum amount, exhibiting a resistance.

3. Structure as in claim 2 in which said means for biasing biases said two oppositely poled series-connected varactors so that one varactor switches from introducing capacitance into said resonant circuit to introducing resistance into said resonant circuit while the other of said varactors is reverse biased so as to introduce a minimum amount of capacitance into said resonant circuit.

4. Structure as in claim 3 in which said means for biasing includes means for varying the nominal bias applied to said two oppositely poled, series-connected varactors thereby to vary the portion of each cycle during which each varactor switches from introducing capacitance into said resonant circuit to introducing resistance into said resonant circuit, thus to vary the average capacitance introduced by said two varactors into said resonant circuit over one cycle of the output signal from said oscillator, and thereby to vary the resonant frequency of said resonant circuit.